United States Patent
Xiao et al.

(10) Patent No.: US 10,249,924 B2
(45) Date of Patent: Apr. 2, 2019

(54) COMPACT VIA STRUCTURES AND METHOD OF MAKING SAME

(71) Applicant: Intel Corporation, Santa Clara, CA (US)

(72) Inventors: Kai Xiao, University Place, WA (US); Raul Enriquez Shibayama, Zapopan (MX); Gong Ouyang, Olympia, WA (US); Jose Diego Guillen Gonzalez, Guadalajara (MX); Beom-Taek Lee, Mountain View, CA (US)

(73) Assignee: INTEL CORPORATION, Santa Clara, CA (US)

( * ) Notice: Subject to any disclaimer, the term of this patent is extended or adjusted under 35 U.S.C. 154(b) by 29 days.

(21) Appl. No.: 14/752,642

(22) Filed: Jun. 26, 2015

(65) Prior Publication Data

US 2016/0378215 A1     Dec. 29, 2016

(51) Int. Cl.
| | |
|---|---|
| G06F 3/041 | (2006.01) |
| H01P 3/08 | (2006.01) |
| H05K 1/02 | (2006.01) |
| H05K 1/11 | (2006.01) |
| H05K 3/40 | (2006.01) |
| H05K 3/42 | (2006.01) |
| H01P 5/02 | (2006.01) |

(52) U.S. Cl.
CPC .............. *H01P 3/08* (2013.01); *H05K 1/0251* (2013.01); *H05K 1/116* (2013.01); *H05K 3/403* (2013.01); *H01P 5/028* (2013.01); *H05K 3/429* (2013.01); *H05K 2201/09645* (2013.01); *H05K 2201/09854* (2013.01)

(58) Field of Classification Search
CPC ................ H01P 3/08; G06F 2203/04103
USPC .......... 174/762; 345/173; 333/208; 427/97.7
See application file for complete search history.

(56) References Cited

U.S. PATENT DOCUMENTS

| | | | |
|---|---|---|---|
| 7,094,060 B2* | 8/2006 | Zhang .................... | H05K 1/115 439/55 |
| 7,897,880 B1 | 3/2011 | Goergen et al. | |
| 2002/0131247 A1* | 9/2002 | Cooray .................... | H01B 3/40 361/750 |
| 2002/0179332 A1 | 12/2002 | Uematsu et al. | |

(Continued)

OTHER PUBLICATIONS

International Search Report and Written Opinion for PCT Application No. PCT/US2016/033812 dated Aug. 24, 2016, 15 pages.

(Continued)

*Primary Examiner* — Timothy J Thompson
*Assistant Examiner* — Charles Pizzuto
(74) *Attorney, Agent, or Firm* — Womble Bond Dickson (US) LLP

(57) ABSTRACT

Techniques and mechanisms to provide a compact arrangement of vias extending through at least a portion of a printed circuit board (PCB) or other substrate. In an embodiment, the substrate includes a dielectric material and a sidewall structure forming a hole region that extends at least partially through the dielectric material. The hole region adjoins each of a first via and a second via, and is also located between the first via and second via. In another embodiment, the first via is coupled to exchange a first signal of a differential signal pair, and the second via is coupled to exchange a second signal of the same differential signal pair.

13 Claims, 10 Drawing Sheets

(56) References Cited

U.S. PATENT DOCUMENTS

2004/0251047 A1* 12/2004 Bartley ................. H05K 1/115
                                                            174/262
2007/0294890 A1   12/2007 Gisin et al.
2013/0112470 A1*  5/2013 Ao ....................... H05K 1/0251
                                                            174/266
2013/0327565 A1* 12/2013 Qu ........................ H05K 1/116
                                                            174/266
2016/0073498 A1*  3/2016 Yeo ....................... H05K 1/111
                                                            361/748

OTHER PUBLICATIONS

International Preliminary Report on Patentability and the Written Opinion of the International Searching Authority for International Application No. PCT/US2016/033812, dated Jan. 4, 2018, 11 pages.

* cited by examiner

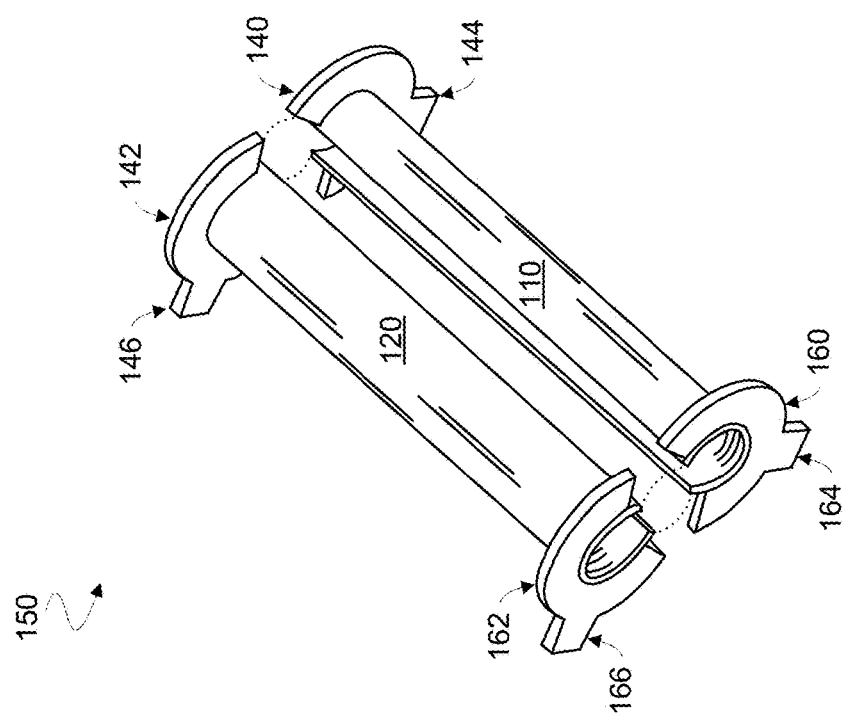
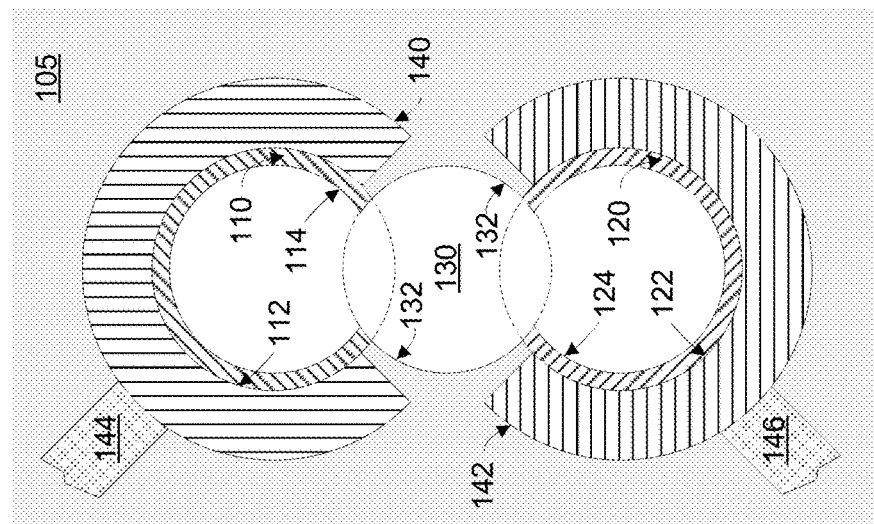
FIG. 1

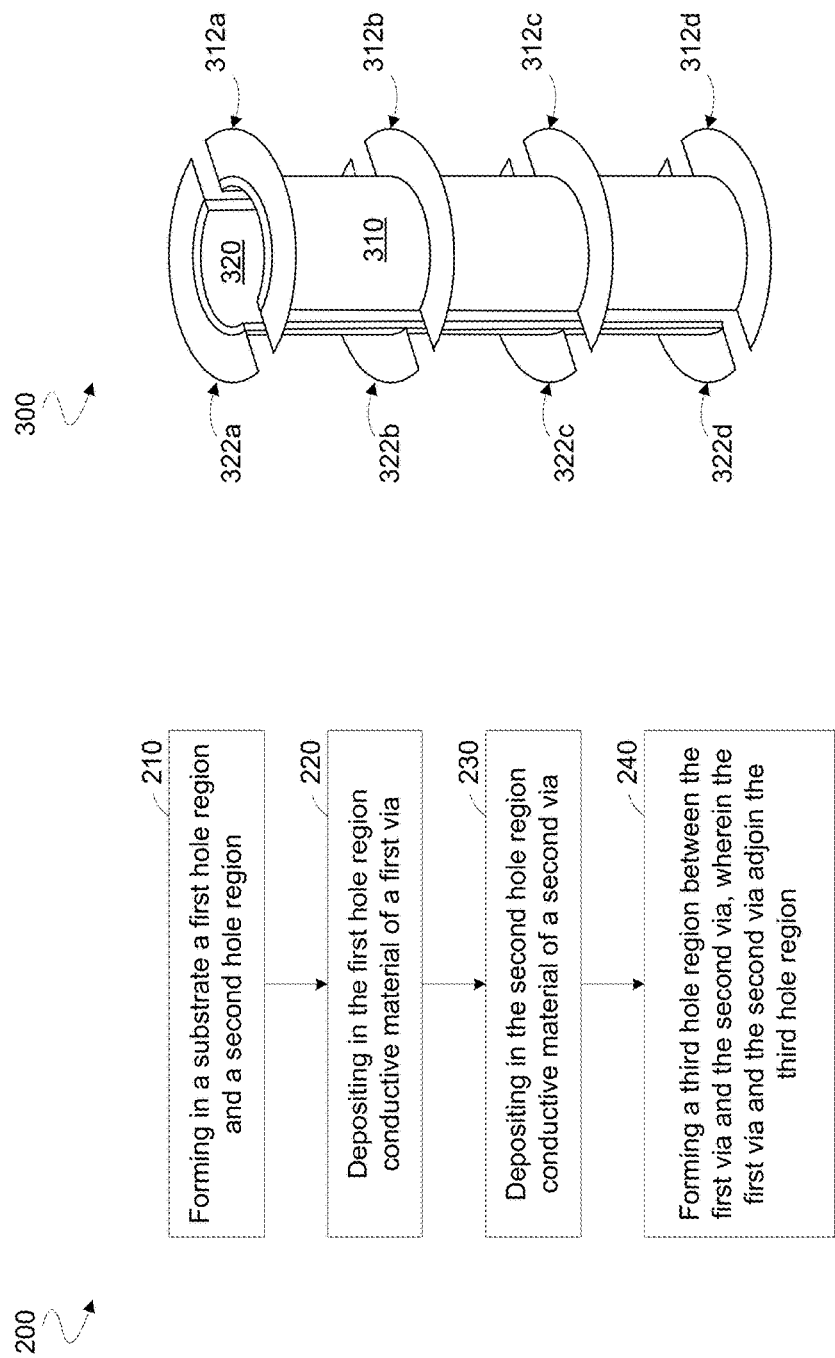

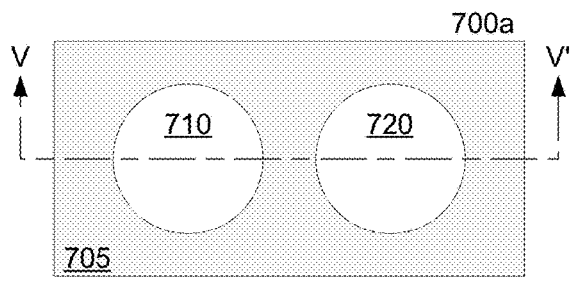
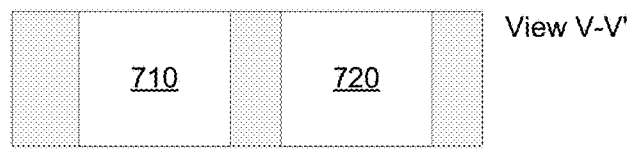
FIG. 7A
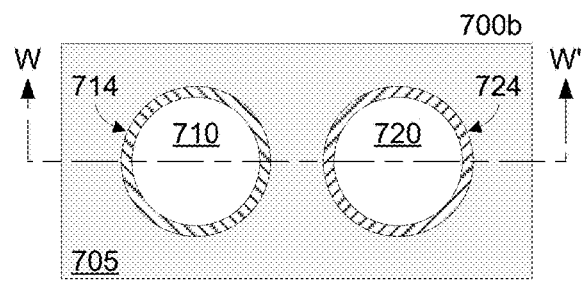
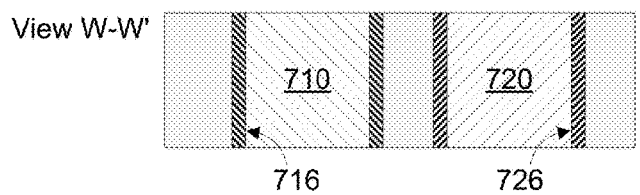
FIG. 7B
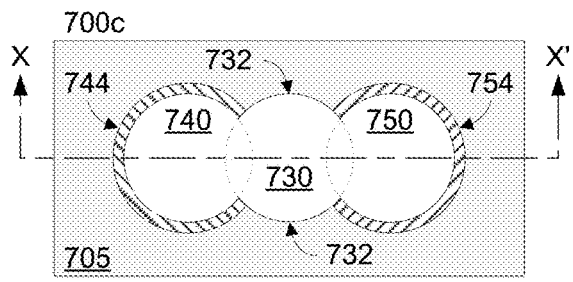
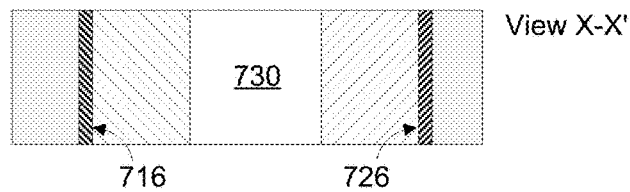
FIG. 7C

COMPACT VIA STRUCTURES AND METHOD OF MAKING SAME

BACKGROUND

1. Technical Field

Embodiments of the invention relate generally to via structures and more particularly, but not exclusively, to fabrication of vias in a printed circuit board.

2. Background Art

Differential signaling by an electronic device is one example of a technique where it is particularly useful to have vias and/or other conductive structures close to one another. In the case of conventional printed circuit board (PCB) manufacturing, holes are drilled in proximity to one another, the holes to later have formed therein respective vias each for propagating through the PCB a different signal of a differential signal pair. The proximity of such vias to one another improves coupling between the signals of the differential signal pair.

However, drilling of such holes is limited by manufacturing tolerances of the fabrication equipment performing the drilling. To avoid the creation of a short between a pair of vias, conventional PCB design must include an offset distance between vias, where the additional distance accommodates a margin of error in the location of one or both holes for such vias. An associated need for impedance control also requires some marginal spacing between vias, in conventional PCB design.

As successive generations of electronic devices continue to exhibit increased functionality such as communication bandwidth, and as these successive generations continue to scale in size, there is expected to be an increasing demand for more compact structures that enable higher-bandwidth signal exchanges. Existing techniques to fabricate vias pose one constraint on how this demand is to be met.

BRIEF DESCRIPTION OF THE DRAWINGS

The various embodiments of the present invention are illustrated by way of example, and not by way of limitation, in the figures of the accompanying drawings and in which:

FIG. 1 shows a layout diagram and a perspective view each illustrating via structures of a device according to an embodiment.

FIG. 2 is a flow diagram illustrating elements of a method to fabricate via structures according to an embodiment.

FIG. 3 is a perspective view illustrating elements of an electronic device including vias arranged according to an embodiment.

FIGS. 7A-7E variously show top views and cross-sectional views illustrating respective processing to fabricate vias according to an embodiment.

DETAILED DESCRIPTION

Figure 4A:
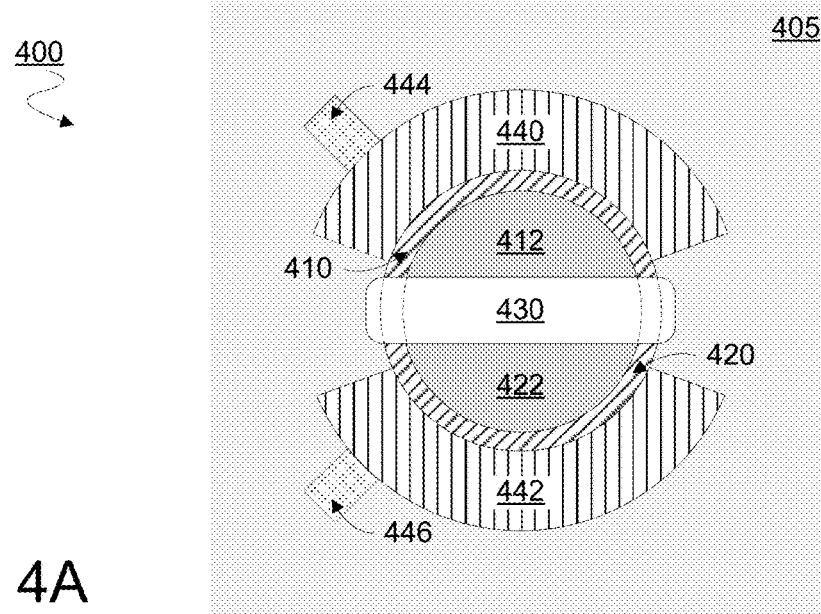
FIGS. 4A, 4B are layout diagrams each illustrating elements of via structures according to a corresponding embodiment.

Embodiments discussed herein variously relate to via structures that allow for compact circuit design. Current fabrication techniques, such as those for printed circuit board (PCB) manufacturing, variously drill separate holes in a PCB, each hole to accommodate a different via. Various embodiments reduce or eliminate the need for a designed offset between such holes where such offset is needed in conventional design and fabrication to account for a margin of error and/or impedance control in the placement of such holes.

While the present disclosure is described herein with reference to illustrative embodiments for particular applications, it should be understood that such embodiments are exemplary only and that the invention as defined by the appended claims is not limited thereto. Those skilled in the relevant art(s) with access to the teachings provided herein will recognize additional modifications, applications, and embodiments within the scope of this disclosure, and additional fields in which embodiments of the present disclosure would be of utility. Certain embodiments are discussed herein with respect to the formation of various hole regions by drilling. Such hole regions may be formed by any of various techniques including, for example, mechanical drilling with a drill bit, laser drilling, lateral movement of a drill bit (or laser) during drilling, punching a via structure into a substrate and/or the like.

The technologies described herein may be implemented in one or more electronic devices. Non-limiting examples of electronic devices that may utilize the technologies described herein include any of various types of mobile devices and/or stationary devices, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, wearable electronics, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of various electronic devices configured to exchange signals each through a respective via.

FIG. 1 shows a top view of a device 100 including via structures according to an embodiment. Device 100 may include, or function as a component of, any of a variety of electronic devices including, but not limited to, a mobile device (e.g., a smart phone, tablet, palmtop, etc.), desktop computer, laptop computer, server and/or the like.

Device 100 is one example of an embodiment comprising a substrate and vias that each extend at least partially through a dielectric material of the substrate. Two vias may extend at least partially through one or more layers of dielectric material, where a sidewall structure or structures of the one or more layers form at least in part a hole region that adjoins both vias and that also extends at least partially through such one or more layers of dielectric material. Device 100 may include a PCB and hardware variously disposed therein and/or thereon. In another embodiment, device 100 is a packaged device including integrated circuitry, a packaging material and vias extending from the integrated circuitry at least partially through the packaging material. In another embodiment, device 100 is a flexible printed circuit. However, embodiments may include any of a variety of other of devices, as variously described herein.

In the illustrated embodiment, device 100 includes a substrate 105 and vias 110, 120 extending from one level (e.g., a surface) of substrate 105 to some other level. Substrate 105 may include any of a variety of dielectric polymers, epoxies, resins and/or other materials used in PCB manufacturing and/or integrated circuit (IC) packaging. Such dielectric materials may include, but are not limited to, one or more of polyimide, polytetrafluoroethylene (PTFE), FR-2, FR-4 and/or the like.

Via 110 may be coupled to communicate a first signal of a differential signal pair, where via 120 is coupled to communicate a second signal of that same differential signal pair. One or each of vias 110, 120 may have a cross-sectional profile that conforms at least in part to a circle or other shape including one or more curved sides. For example, an outer sidewall 112 of via 110 may conform to at least a sector of a first circle and/or an outer sidewall 122 of via 120 may conform to at least a sector of a second circle. Although certain embodiments are not limited in this regard, an interior sidewall of via 110 or of via 120 may similarly be circular or otherwise curved—e.g., as represented by the illustrative curved interior sidewalls 114, 124.

Vias 110, 120 may extend at least partially through one or more layers of dielectric material of substrate 105, where a sidewall structure (or structures) 132 of substrate 105 forms a hole region 130 that also extends at least partially through such one or more layers of dielectric material. The location of sidewall structure 132 (and hole region 130) between vias 110, 120 may result from fabrication processing—to remove dielectric material and form hole region 130—that is performed as part of (or alternatively, after) fabrication processing to remove other dielectric material and form other hole regions that are each to accommodate a respective one of vias 110, 120. For example hole 130 may be performed by drilling that is performed after other drilling to form respective holes each to accommodate a corresponding one of vias 110, 120. By forming hole region 130 after the formation of other hole regions for vias 110, 120, certain embodiments variously ensure separation of vias 110, 120 while allowing vias 110, 120 to have a closer overall proximity to each other, as compared to corresponding via proximity that is provided by existing fabrication techniques.

By way of illustration and not limitation, the top view of device 100 includes dashed lines variously representing circular drill bit perimeters, where each such drill bit perimeter corresponds to drilling for a respective one of vias 110, 120 and hole region 130. Existing circuit design and manufacturing techniques would require that the circle representing drilling for via 110 be offset from the circle representing drilling for via 120—e.g., where such offset is not less than a sum of margins of error for placement of such circles. By contrast, certain embodiments variously reduce or eliminate the need for such an offset. For example, in one embodiment, conductive material may be electroplated, sputtered or otherwise deposited into such holes, where a subsequent formation of hole region 130 removes portions of such conductive material to form separate vias 110, 120 that are in close proximity to one another, but not shorted with one another. In such an embodiment, vias 110, 120 may each adjoin hole region 130 and/or the one or more sidewall structures 132 forming hole region 130.

Hole region 130 may be at least partially filled (and/or at least partially empty). For example, some or all of hole region 130 may be a void that lacks at least any solid materials. Alternatively or in addition, at least some of hole region 130 may be back-filled with a dielectric (or other) material. In an embodiment, sidewall structure 132 forms an abraded surface region or other artifact of a drill process that is identifiable as a physical interface between a hole region 130 (and any dielectric or other material disposed therein) and the dielectric material that forms sidewall structure 132 and the adjoining region of substrate 105. Alternatively or in addition, a discontinuity between the respective microscopic structures and/or the chemistry of materials on opposite sides of sidewall structure 132 may distinguish material disposed in hole region 130 from the adjoining dielectric material of substrate 105. In an embodiment, a sidewall of via 110 (and/or a sidewall of via 120) forms a drill process artifact such as an abraded surface region.

Vias 110, 120 may be coupled each to exchange a respective signal—e.g., where vias 110, 120 are to exchange complementary signals of the same differential signal pair. By way of illustration and not limitation, device 100 may also include contact pads 140, 142 coupled to vias 110, 120, respectively, each at a first level (e.g., a surface) of substrate 105. Contact pads 140, 142 may in turn be coupled to traces 144, 146, respectively. Traces 144, 146 may be coupled to other circuitry (not shown), included in or coupled to device 100, where such other circuitry is to variously transmit through traces 144, 146 one or more signals to vias 110, 120 and/or to receive through traces 144, 146 one or more signals from vias 110, 120.

As shown in perspective view 150, vias 110, 120 may be variously coupled each to one or more other contact pads and/or traces at different levels of substrate 105. For example, via 110 may be further coupled to a contact pad 160 and a trace 164 at another level of the dielectric material, where via 120 is further coupled to a contact pad 162 and a trace 166 at that same another level of the dielectric material. Such coupling of vias 110, 120 to various contact and trace structures may allow for differential (or other) signaling across various layers of a PCB, packaged IC device and/or the like. Some or all of vias 110, 120, contact pads 140, 142 and traces 144, 146 may include copper, gold, tin and/or any of a variety of metals used in PCB manufacturing, IC packaging or the like.

In one illustrative embodiment, one or each of vias 110, 120 has a maximum width (e.g., a diameter) that is 8 mils or more. Additionally or alternatively, respective centers of vias 110, 120 may be separated from one another by 40 mils or more. In an embodiment, vias 110, 120 each extend through substrate 105 for a length of 55 mils or more. However, such dimensions are merely illustrative, and can vary considerably in different embodiments according to implementation-specific details. For example, dimensions for embodiments in packaged devices may be significantly smaller.

FIG. 2 illustrates elements of a method 200 for fabricating via structures according to an embodiment. Method 200 may include processing to manufacture vias 110, 120, for example. In an embodiment, method 200 includes, at 210, forming in a substrate a first hole region and a second hole region. The first hole region may extend at least partially through a layer of dielectric material of a substrate—e.g., where the second hole region extends at least partially through the same layer of dielectric material. The forming at 210 may include drilling a first hole including the first hole region and further drilling a second hole, separate from the first hole, including the second hole region. In another embodiment, the forming at 210 includes drilling a single hole including both the first and second hole regions. Such drilling may include operations adapted from conventional drill processes for via formation. Drilling operations performed at 210 may include, for example, moving a drill bit or laser laterally during drilling to form a non-circular (e.g., elliptical, substantially rectilinear, etc.) cross-sectional profile of a hole.

The first hole region and the second hole region may, at some point during or after method 200, accommodate a first via and a second via, respectively. For example, method 200 may include, at 220, depositing in the first hole region conductive material (e.g., copper) of the first via. Method 200 may further include, at 230, depositing in the second hole region conductive material of the second via. The various depositing at 220, 230 may include masking, electroplating, sputtering, etching and/or other operation adapted from conventional PCB manufacturing and/or device packaging techniques. The details of such conventional techniques are not limiting on certain embodiments and are not detailed herein to avoid obscuring certain features of various embodiments. In an embodiment, the various depositing at 220 and 230 results in the respective conductive material of the first via and second via being joined at least during some of method 200. For example, such depositing may form a single mass of conductive material that is to be later partially removed to form two separate conductive vias.

At 240, method 200 may include forming a third hole region between the first hole region and the second hole region—e.g., after forming the first hole region and the second hole region—wherein the first via adjoins the third hole region and wherein the second via adjoins the third hole region. The forming at 240 may comprise forming a single hole that includes the first hole region, the second hole region and the third hole region. In an embodiment, formation of the third hole region at 240 includes drilling to remove at least any conductive material that might be joining the first via and the second via together. In still another embodiment, the forming at 210 and at 240 may be performed by the drilling of only a single hole.

Method 200 may include additional operations (not shown) that, for example, prevent shorting of the first via and the second via and/or that couple the first via and second via each to other respective signaling structures. For example, method 200 may further include depositing in at least part of the third hole region a wall structure, comprising dielectric material, that is to be located between the first via and the second via. In an embodiment, the depositing at 220 and/or the depositing at 230 is performed after such a wall structure is formed. Alternatively or in addition, method 200 may further couple the first via and the second via each to a respective one or more contact pads—e.g., where each such one or more contact pads is in turn to be coupled to a trace or other signal line structure.

FIG. 3 illustrates elements of a device 300 including via structures according to an embodiment. Device 300 may include features such as those of device 100, for example. In an embodiment, fabricating vias of device 300 includes some or all of the operations of method 200.

As shown in FIG. 3, device 300 may include vias 310, 320 which each extend through one or more layers of dielectric material of a substrate of device 300 (not shown to avoid obscuring features of vias 310, 320). Vias 310, 320 may provide functionality corresponding to that of vias 110, 120, respectively. In an embodiment, device 300 includes a plurality of contact pads—represented by the illustrative contact pads 312a, 312b, 312c, 312d—each coupled to the via 310 at a different respective level of the substrate. Alternatively or in addition, device 300 may include another plurality of contact pads—represented by the illustrative contact pads 322a, 322b, 322c, 322d—each coupled to the via 300 at a different respective one of the same (or different) levels of the substrate. Contact pads 312a, 312b, 312c, 312d and contact pads 322a, 322b, 322c, 322d may be variously coupled to respective traces (not shown) to allow for any of various signal exchanges by vias 310, 320 at different levels of the substrate.

FIG. 4A illustrates elements of a device 400 including via structures according to another embodiment. Device 400 may include features of device 100, for example. Fabrication of via structures of device 400 may include some or all operations of method 200. In an embodiment, device 400 includes a substrate 405, comprising one or more layers of dielectric material, and via structures 410, 420 (e.g., corresponding to vias 110, 120, respectively) each extending at least partially through such one or more layers. A sidewall structure also extending at least partially through the one or more dielectric layers may form, at least in part, a hole region 430 that is between and adjacent to via structures 410, 420.

In the illustrative embodiment shown, hole regions each to accommodate a respective one of via structures 410, 420 are formed by drilling a single hole that, for example, has a circular cross-section. Subsequently, electroplating (for example) may variously deposit copper and/or other conductive material that is to variously form via structures 410, 420 at least in part. Drilling to form hole region 430 may assure separation of via structures 410, 420—e.g., while providing for improved proximity of via structures 410, 420 to one another, as compared to conventional fabrication processing. Hole region 430 is one example of a substantially rectilinear structure formed by sidewalls extending through substrate 405, where hole region 430 is defined in part by various flat sidewall portions. In an embodiment, contact pads 440, 442 are coupled to via structures 410, 420, respectively, at a particular level (e.g., a surface) of substrate 405. In turn, contact pads 440, 442 may be coupled to traces 444, 446, respectively, to provide for signal exchanges to and/or from vias 410, 420.

Additional conductive material may be variously deposited into hole regions 412, 422 on opposite sides of hole region 430—e.g., after a wall of dielectric material is deposited into the drilled hole region 430. In another embodiment, conductive material of hole region 412 is contiguous with (integrated with) via structure 410 and/or conductive material of hole region 422 is contiguous with (integrated with) via structure 420. In still another embodiment, dielectric material is deposited into hole regions 412, 422 (e.g., in addition to hole region 430).

Figure 4B:
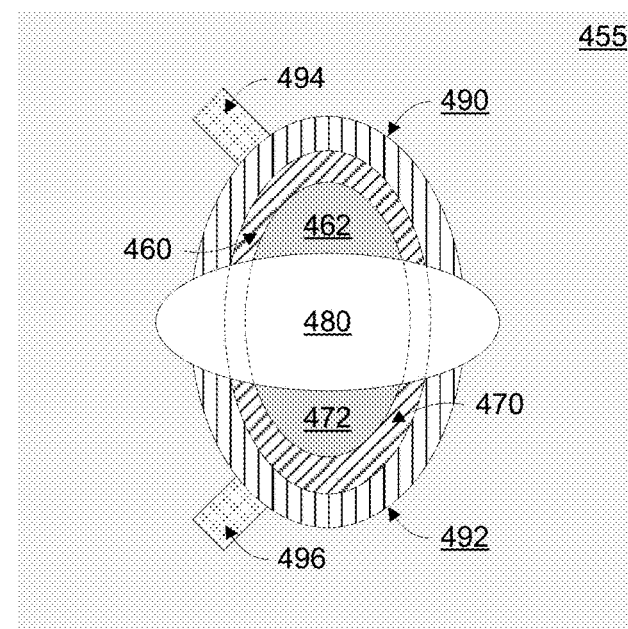

FIG. 4B illustrates via structures of a device 450 according to another embodiment. Device 450 may include features of device 100, 300, 400 or the like. In an embodiment, device 450 includes a substrate 455 and via structures 460, 470 (e.g., corresponding to vias 110, 120, respectively) each extending at least partially through one or more dielectric layers of substrate 455. A sidewall structure also extending at least partially through the one or more dielectric layers may form, at least in part, a hole region 480 that is between, and adjacent to each of, via structures 460, 470. A hole region 462 of device 450 may include or adjoin via structure 460 and/or hole region 472 may include or adjoin via structure 470. Hole regions 462, 472 may have respective features of 412, 422, for example. Contact pads 490, 492 and traces 494, 496 of device 450 may correspond functionally to contact pads 440, 442 and traces 444, 446, respectively.

Device 450 provides one example of via structures formed by drilling non-circular (in this embodiment, elliptical) holes to variously form hole regions to accommodate vias and/or to separate such vias from one another. For example, a hole drilled to have an elliptical cross-section may include two hole regions each to accommodate a respective one of via structures 460, 470. Subsequent drilling within a different elliptical cross-sectional profile may form a hole region 480 that adjoins via structures 460, 470 and that prevents a direct contact of via structures 460, 470 with one another. In the example of device 450, drilling to form sidewall structures around hole region 480 also shapes respective edges of contact pads 490, 492 that adjoin such sidewall structures. However, certain embodiments are not limited in this regard—e.g., as illustrated in the example embodiment of device 400.

Figure 5A:
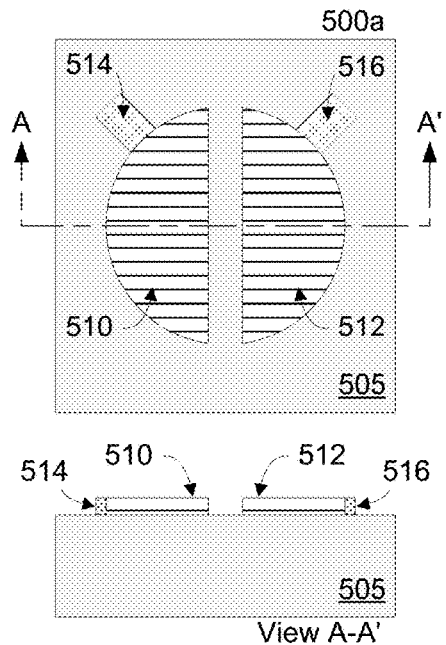
FIGS. 5A-5D variously show top views and cross-sectional views illustrating respective processing to fabricate vias according to an embodiment.
Figure 5B:
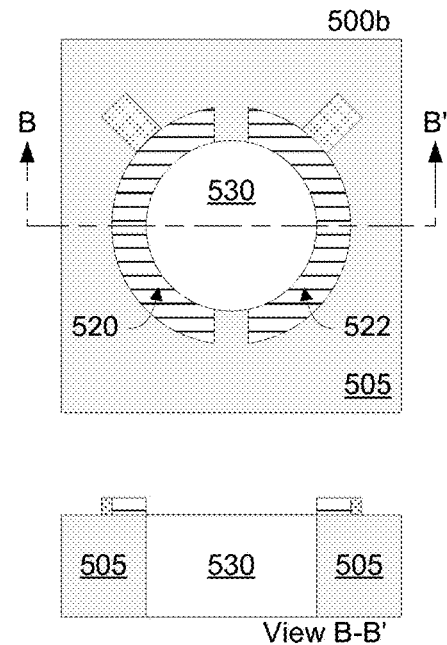

FIGS. 5A through 5D illustrate processing to fabricate via structures of an electronic device, such as device 100, according to an embodiment. Processing such as that represented by FIGS. 5A through 5D may represent some or all operations of method 300, for example. FIG. 5A shows a top view 500a and a cross-sectional view A-A' for a point in fabrication processing when conductive regions 510, 512 and traces 514, 516 are formed on a dielectric 505 of a substrate—e.g., using mask and electroplating operations adapted from conventional PCB manufacturing techniques. Subsequently, as shown in a top view 500b and a cross-sectional view B-B' of FIG. 5B, a hole 530 may be drilled at least partially through dielectric 505. Although certain embodiments are not limited in this regard, hole 530 may also be drilled though portions of conductive regions 510, 512 to form contact pads 520, 522. In another embodiment, contact pads 520, 522 and traces 514, 516 are not formed on dielectric 505 until after other via structures have been completed.

Figure 5C:
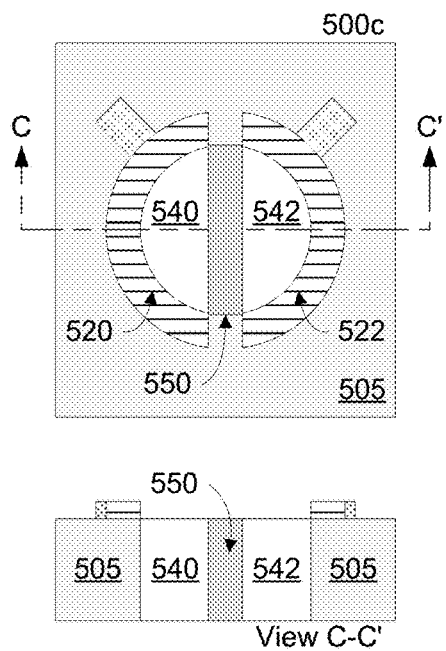
Figure 5D:
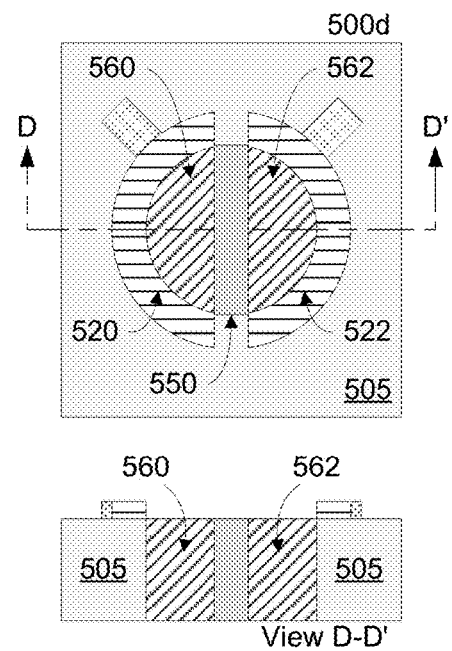

FIG. 5C shows a top view 500c and a cross-sectional view C-C' for a point in fabrication processing dielectric wall structure 550 is formed between different hole regions 540, 542 of the hole 530. Formation of wall structure 550 may include selective mask, deposition and/or etching processing such as that adapted from conventional PCB and/or package fabrication techniques. As shown in a top view 500d and a cross-sectional view D-D' of FIG. 5D, wall structure 550 may provide for separation of vias 560, 562 that are variously electroplated, sputtered or otherwise deposited in hole regions 540, 542, respectively. In one embodiment, wall structure 550 is subsequently etched away or otherwise removed—e.g., where vias 560, 562 are to be separated merely by a void (e.g., including air). The location of vias 560, 562 within a single drill hole—while assuring separation of vias 560, 562 from one another in said drill hole—illustrates another example of compact differential via pairs in a PCB (or other device) according to an embodiment.

Figure 6A:
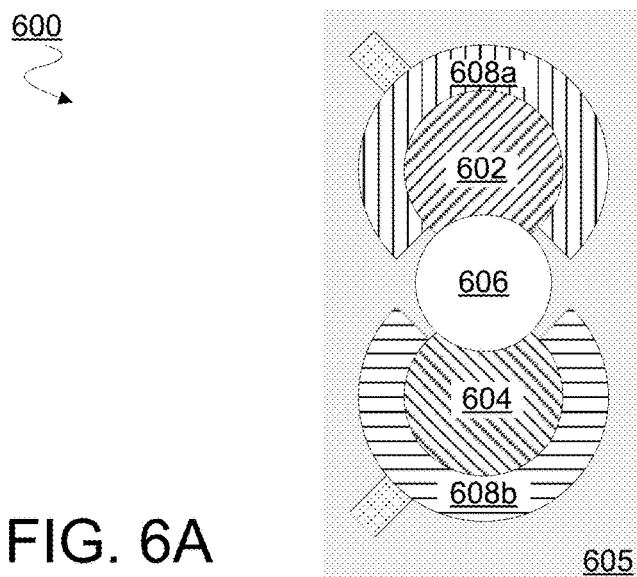
FIGS. 6A-6D are layout diagrams each illustrating elements of via structures according to a corresponding embodiment.

FIG. 6A illustrates via structures of a device 600 according to an embodiment. Device 600 may include features of device 100, for example. In an embodiment, device 600 includes a substrate 605 and vias 602, 604 each extending at least partially through one or more dielectric layers of substrate 605. A sidewall structure also extending at least partially through one or more dielectric layers may form, at least in part, a hole region 606 that is between, and adjacent to each of, vias 602, 604. Contact pads 608a, 608b of device 600 may correspond functionally to contact pads 440, 442, respectively. In the example of device 600, sidewall structures of one or both of vias 602, 604, as well as other sidewall structures of substrate 605 (that form hole region 606 at least in part), all conform to the same circular cross-sectional shape. Hole region 606 may have a void therein—e.g., where air separates vias 602, 604 from one another in hole region 606.

Figure 6B:
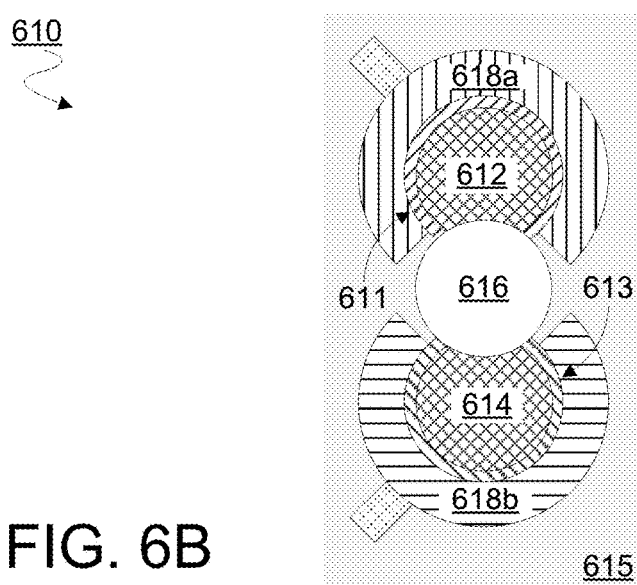

FIG. 6B illustrates via structures of a device 610 according to another embodiment. Device 610 includes a substrate 615 and via structures 611, 613 extending at least partially through substrate 615, where sidewall structures of substrate 615 that form a hole region 616 are variously located between, and adjacent to, via structures 611, 613. Via structures 611, 613 and hole region 616 may correspond functionally to vias 602, 604 and hole region 606, respectively. Contact pads 618a, 618b of device 600 may correspond functionally to contact pads 608a, 608b, respectively. In an embodiment, additional conductive material may be variously deposited into hole regions 612, 614 on opposite sides of hole region 616—e.g., after a plating or other deposition to form via strictures 611, 613 but before drilling to form hole region 616. In such an embodiment, via structure 611 and the conductive material in hole region 612 form one via, where via structure 613 and the conductive material in hole region 614 form another via. In another embodiment, dielectric material is deposited into one or both of hole regions 612, 614. Sidewalls surrounding hole region 616 may all conform to a single circular cross-sectional shape, although some embodiments are not limited in this regard. Alternatively or in addition, hole region 606 may have a void therein.

Figure 6C:
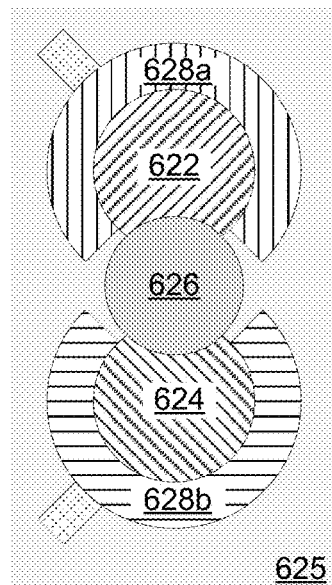

FIG. 6C illustrates via structures of a device 620 according to another embodiment. Device 620 includes a substrate 625 and vias 622, 624 extending at least partially through substrate 625, where sidewall structures of substrate 625 that form a hole region 626 are variously located between, and adjacent to, vias 622, 624. Vias 622, 624 and hole region 626 may correspond functionally to vias 602, 604 and hole region 606, respectively. Contact pads 628a, 628b of device 600 may correspond functionally to contact pads 608a, 608b, respectively. Device 620 may be distinguished from device 600, for example, at least insofar a dielectric material (such as that of substrate 625) is deposited back into the hole region 626 that is drilled or otherwise formed in substrate 625. In an embodiment, drilling to form hole region 626 is performed after deposition of metal for vias 622, 624.

Figure 6D:
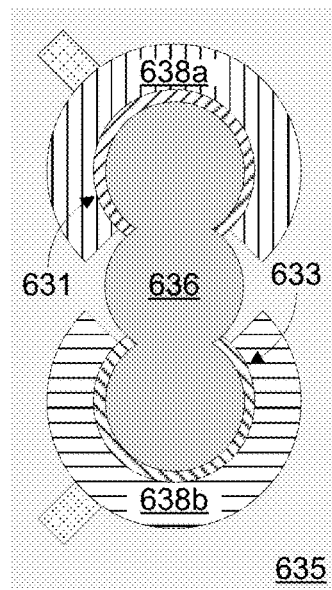

FIG. 6D illustrates via structures of a device 630 according to another embodiment. Device 630 includes a substrate 635 and vias 631, 633, where sidewall structures of substrate 635 form a hole region 636 between, and adjacent to, vias 631, 633. Vias 631, 633 and hole region 636 may correspond functionally to vias 602, 604 and hole region 606, respectively, where contact pads 638a, 638b of device 600 correspond functionally to contact pads 608a, 608b, respectively. In the example of device 600, curved interior sidewalls of vias 631, 633 form respective lobes of a single hole that also includes hole region 636. Such a hole may be formed by drilling two separate holes, each to accommodate a respective one of vias 631, 633, and then—e.g., after depositing metal for vias 631, 633—performing drilling to remove from substrate 605 dielectric material that separates the two previously-drilled holes. In an embodiment, the entire hole may be filled with a dielectric material.

Figure 7D:
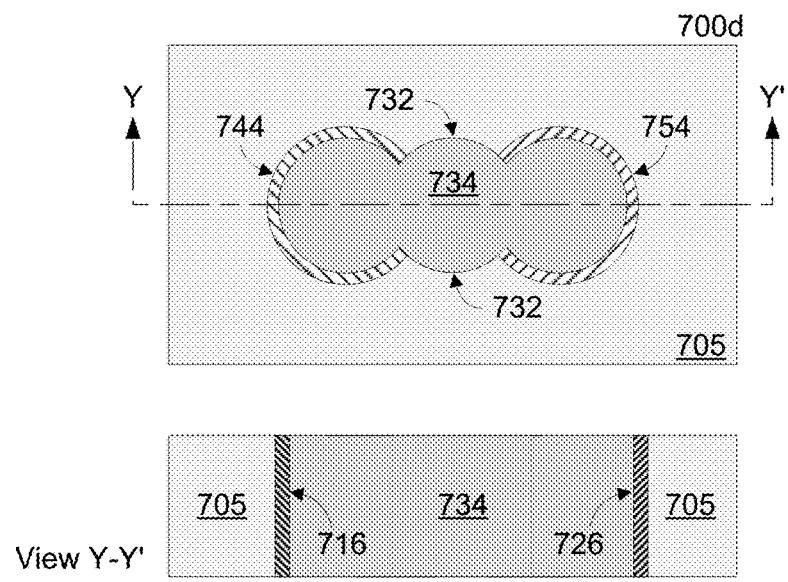
Figure 7E:
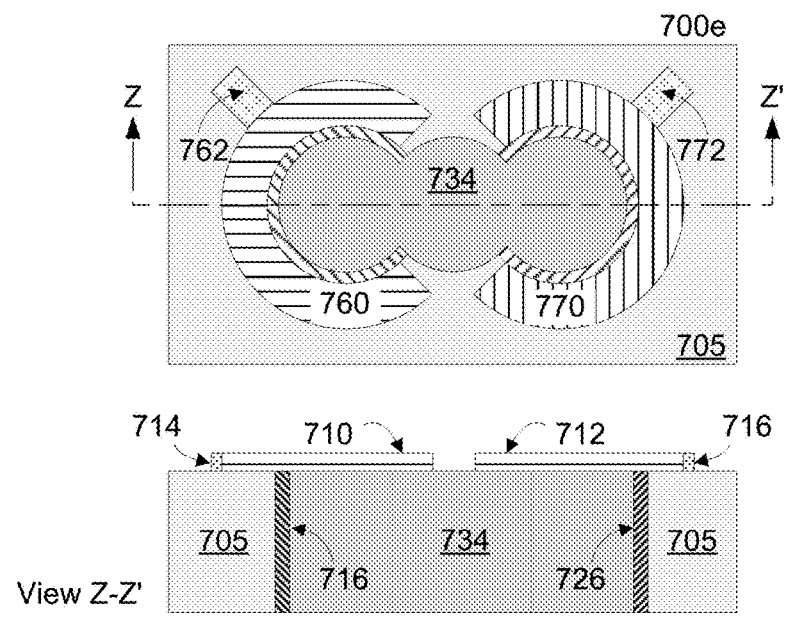

FIGS. 7A through 7E illustrate processing to fabricate via structures of an electronic device, such as device 630, according to an embodiment. Processing such as that represented by FIGS. 7A through 7E may represent some or all operations of method 300, for example. FIG. 7A shows a top view 700a and a cross-sectional view V-V' for a point in fabrication processing when holes 710, 720 are drilled or otherwise formed to extend at least partially through a dielectric 705 of a substrate. Subsequently, as shown in a top view 700b and a cross-sectional view W-W' of FIG. 7B, electroplating, sputtering or other such processing is performed to deposit conductive structures 714, 724 in holes 710, 720, respectively. FIG. 7C shows a top view 700c and a cross-sectional view X-X' for a point in fabrication processing when a portion of dielectric 705 between holes 710, 720 is drilled out to form a hole region 730. Portions of conductive structures 714, 724 may also be removed to form, at least in part, vias 744, 754. In an embodiment, respective curved interior sidewalls 716, 726 of vias 744, 754 variously adjoin sidewall structures 732 of substrate 705 that form hole region 730. As shown in a top view 700d and a cross-sectional view Y-Y' of FIG. 7D, the hole formed at least in part by the sidewall structures 716, 726, 732 may be subsequently filled (partially or entirely) with dielectric material 734. Subsequently, contact pads 760, 770 and/or traces 762, 772 may be formed on the surface of substrate 705, as shown in FIG. 7E. In some embodiments, contact pads 760, 770 are a preformed part of a copper layer that is covered by a photoresist during some or all of the manufacturing process to form vias 744, 754. Respective edges of contact pads 760, 770 may be offset from sidewall structures 732, although certain embodiments are not limited in this regard.

Figure 8:
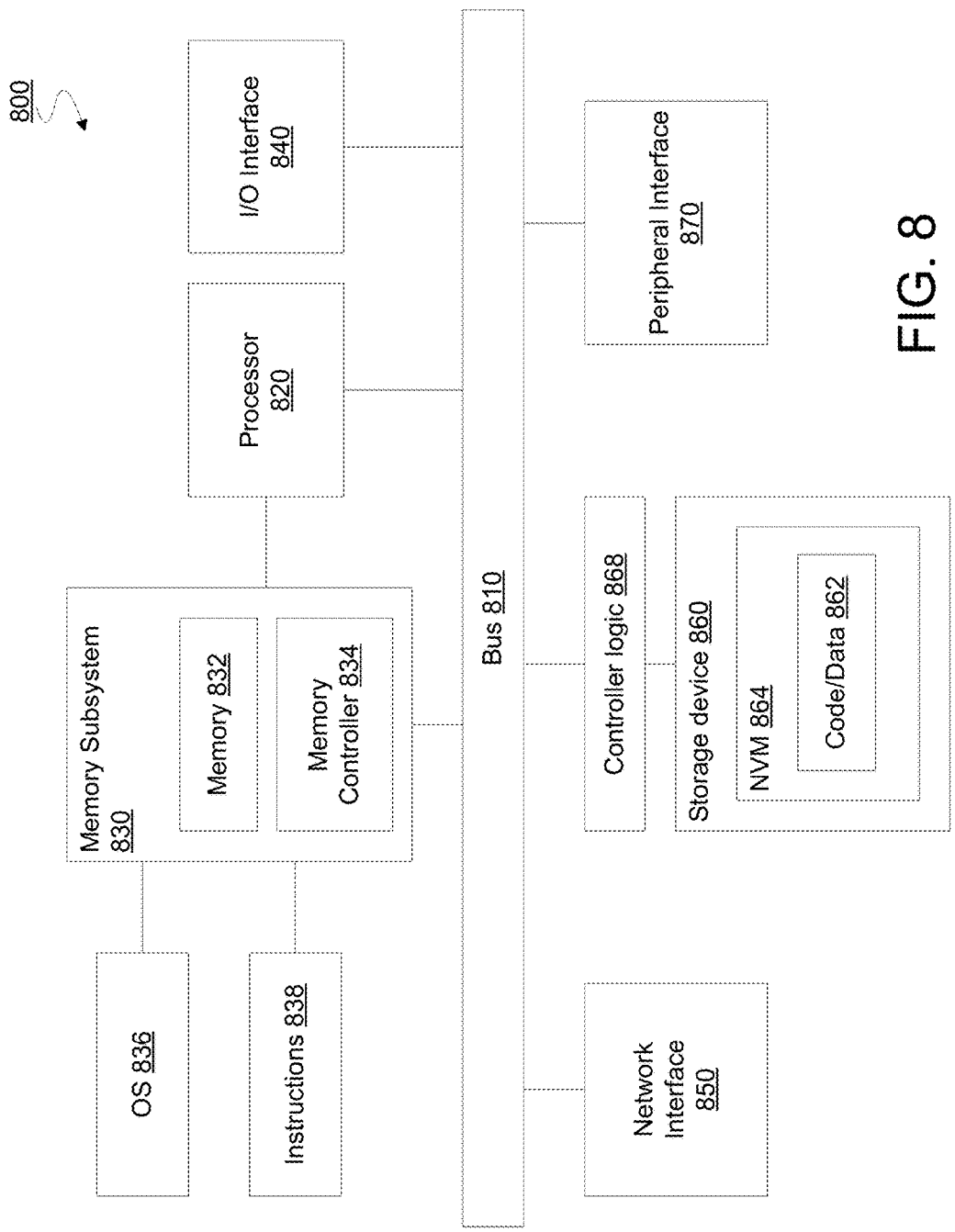
FIG. 8 is a functional block diagram illustrating elements of a computer system including via structures according to an embodiment.

FIG. 8 is a block diagram of an embodiment of a computing system in which signal exchanges with via structures may be implemented. System 800 represents a computing device in accordance with any embodiment described herein, and may be a laptop computer, a desktop computer, a server, a gaming or entertainment control system, a scanner, copier, printer, or other electronic device. System 800 may include processor 820, which provides processing, operation management, and execution of instructions for system 800. Processor 820 may include any type of microprocessor, central processing unit (CPU), processing core, or other processing hardware to provide processing for system 800. Processor 820 controls the overall operation of system 800, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 may include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820.

Storage device 860 may be or include any conventional nonvolatile medium (NVM) 864 for storing large amounts of data in a nonvolatile manner, such as one or more magnetic, solid state, or optical based disks, or a combination. NVM 864 may store code or instructions and data 862 in a persistent state (i.e., the value is retained despite interruption of power to system 800). Access to NVM 864 may be provided with controller logic 868 coupled to (or in some embodiments, included in) storage device 860. For example, controller logic 868 or may be any of the variety of host controller logic to exchange data frames to access NVM 864. Storage device 860 may be generically considered to be a "memory," although memory 830 is the executing or operating memory to provide instructions to processor 820. Whereas storage 860 is nonvolatile, memory 830 may include volatile memory (i.e., the value or state of the data is indeterminate if power is interrupted to system 800).

Memory subsystem 830 may include memory device 832 where it stores data, instructions, programs, or other items. In one embodiment, memory subsystem 830 includes memory controller 834 to provide access to memory 832—e.g., on behalf of processor 820.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 may include, for example, one or more of a system bus, a Peripheral Component Interconnect (PCI) bus, an Open Core Protocol (OCP) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 may also correspond to interfaces in network interface 850.

System 800 may also include one or more input/output (I/O) interface(s) 840, network interface 850, one or more internal mass storage device(s) 860, and peripheral interface 870 coupled to bus 810. I/O interface 840 may include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 may include an Ethernet adapter, wireless interconnection components, USB (universal serial bus), or other wired or wireless standards-based or proprietary interfaces.

Peripheral interface 870 may include any hardware interface not specifically mentioned above. Peripherals refer generally to devices that connect dependently to system 800. A dependent connection is one where system 800 provides the software and/or hardware platform on which operation executes, and with which a user interacts.

Figure 9:
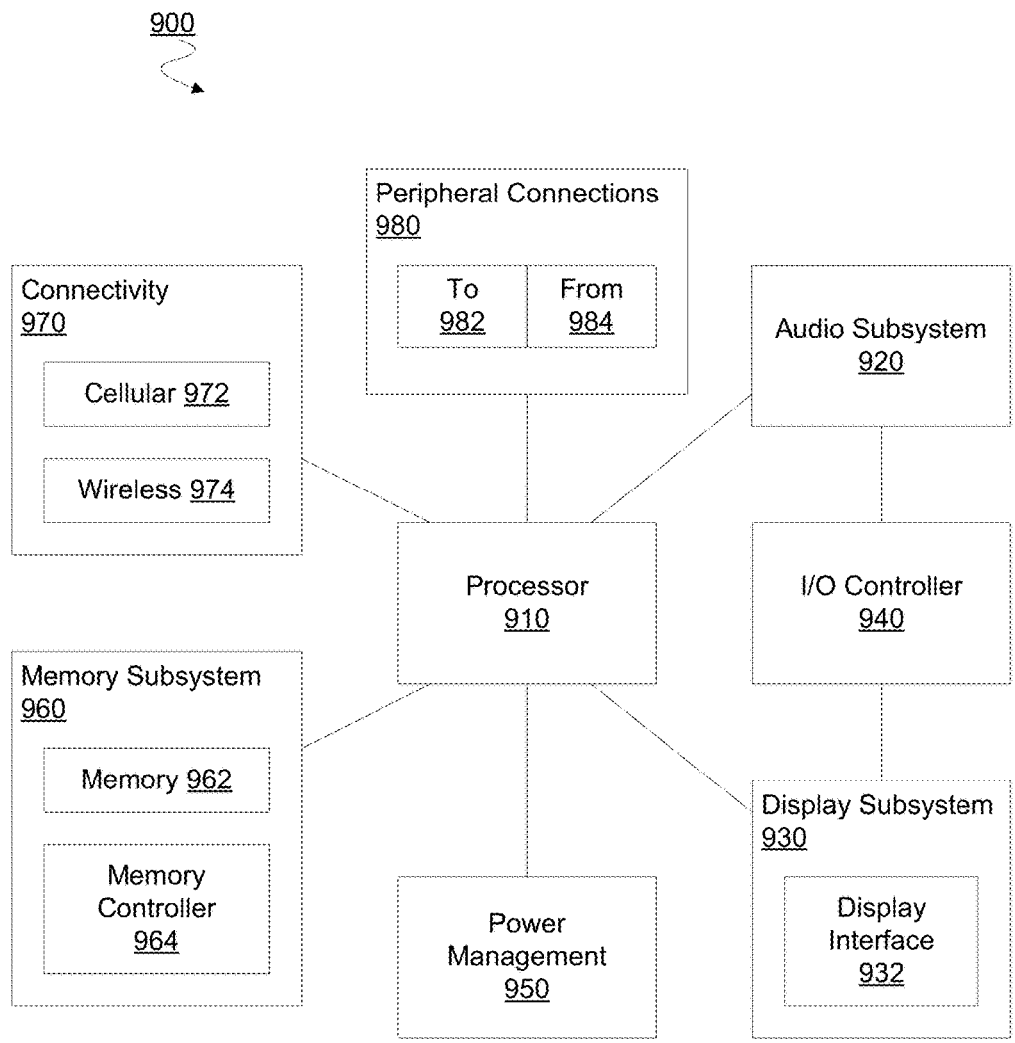
FIG. 9 is a functional block diagram illustrating elements of a mobile device including via structures according to an embodiment.

FIG. 9 is a block diagram of an embodiment of a mobile device in which signal exchanges with via structures may be implemented. Device 900 represents a mobile computing device, such as a computing tablet, a mobile phone or smartphone, a wireless-enabled e-reader, or other mobile device. It will be understood that certain of the components are shown generally, and not all components of such a device are shown in device 900.

Device 900 may include processor 910, which performs the primary processing operations of device 900. Processor 910 may include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations may also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 may include display interface 932, which may include the particular screen or hardware device used to provide a display to a user. In one embodiment, display interface 932 includes logic separate from processor 910 to perform at least some processing related to the display. In one embodiment, display subsystem 930 includes a touchscreen device that provides both output and input to a user.

I/O controller 940 represents hardware devices and software components related to interaction with a user. I/O controller 940 may operate to manage hardware that is part of audio subsystem 920 and/or display subsystem 930. Additionally, I/O controller 940 illustrates a connection point for additional devices that connect to device 900 through which a user might interact with the system. For example, devices that may be attached to device 900 might include microphone devices, speaker or stereo systems, video systems or other display device, keyboard or keypad devices, or other I/O devices for use with specific applications such as card readers or other devices.

As mentioned above, I/O controller 940 may interact with audio subsystem 920 and/or display subsystem 930. For example, input through a microphone or other audio device may provide input or commands for one or more applications or functions of device 900. Additionally, audio output may be provided instead of or in addition to display output. In another example, if display subsystem includes a touchscreen, the display device also acts as an input device, which may be at least partially managed by I/O controller 940. There may also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that may be included in device 900. The input may be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Memory subsystem 960 may include memory device(s) 962 for storing information in device 900. Memory subsystem 960 may include nonvolatile (state does not change if power to the memory device is interrupted) and/or volatile (state is indeterminate if power to the memory device is interrupted) memory devices. Memory 960 may store application data, user data, music, photos, documents, or other data, as well as system data (whether long-term or temporary) related to the execution of the applications and functions of system 900.

In one embodiment, memory subsystem 960 includes memory controller 964 (which could also be considered part of the control of system 900, and could potentially be considered part of processor 910). Connectivity 970 may include hardware devices (e.g., wireless and/or wired connectors and communication hardware) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 may include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector may allow device 900 to connect to certain peripherals that allow device 900 to control content output, for example, to audiovisual or other systems.

In addition to a proprietary docking connector or other proprietary connection hardware, device 900 may make peripheral connections 980 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a device comprises a substrate including a layer of dielectric material, wherein the substrate includes a sidewall structure forming a hole region that extends at least partially through the layer of dielectric material. The device further comprises a first via extending at least partially through the layer of dielectric material, the first via adjacent to the sidewall structure, and a second via extending at least partially through the layer of dielectric material, the second via adjacent to the sidewall structure.

In an embodiment, the substrate includes a printed circuit board. In another embodiment, a packaging of the device includes the substrate. In another embodiment, the first via is coupled to communicate a first signal of a differential signal pair, and the second via is coupled to communicate a second signal of the differential signal pair. In another embodiment, the sidewall structures include a first curved sidewall portion and a second sidewall portion opposite the first sidewall portion. In another embodiment, a void is located in the hole region. In another embodiment, at least some of the hole region has a first dielectric disposed therein.

In another embodiment, the device further comprises a first plurality of contact pads each coupled to the first via at a different respective level of the substrate. In another embodiment, the device further comprises a second plurality of contact pads each coupled to the second via at a different respective level of the substrate. In another embodiment, the sidewall structure forms a drill process artifact. In another embodiment, a sidewall of the first via or a sidewall of the second via forms another drill process artifact. In another embodiment, a cross-sectional profile of the first via conforms to a sector of a first circle, wherein a cross-sectional profile of the second via conforms to a sector of a second circle, and wherein a cross-sectional profile of sidewall structure conforms to a sector of a third circle overlapping both the first circle and the second circle.

In another implementation, method comprises forming in a substrate a first hole region that extends at least partially through a layer of dielectric material of a substrate, and a second hole region that extends at least partially through the layer of dielectric material of a substrate. The method further comprises depositing in the first hole region conductive material of the first via, depositing in the second hole region conductive material of the second via, and forming a third hole region between the first hole region and the second hole region, wherein the first via adjoins the third hole region and wherein the second via adjoins the third hole region. In an embodiment, depositing the conductive material of the first via and depositing the conductive material of the second via is performed before forming the third hole region. In another embodiment, forming the third hole region includes removing conductive material between the conductive material of the first via and the conductive material of the second via. In another embodiment, the substrate includes a printed circuit board. In another embodiment, the substrate includes a packaging material of a packaged integrated circuit device.

In another embodiment, the method further comprises coupling the first via to communicate a first signal of a differential signal pair, and coupling the second via to communicate a second signal of the differential signal pair. In another embodiment, the sidewall structures include a first curved sidewall portion and a second sidewall portion opposite the first sidewall portion. In another embodiment, the method further comprises, after forming the third hole region, depositing a dielectric material into the third hole region. In another embodiment, the method further comprises coupling a first plurality of contact pads each to the first via at a different respective level of the substrate. In another embodiment, the method further comprises coupling a second plurality of contact pads each to the second via at a different respective level of the substrate. In another embodiment, a cross-sectional profile of the first via conforms to a sector of a first circle, wherein a cross-sectional profile of the second via conforms to a sector of a second circle, and wherein a cross-sectional profile of sidewall structure conforms to a sector of a third circle overlapping both the first circle and the second circle.

In another implementation, a system comprises a substrate including a layer of dielectric material, wherein the substrate includes a sidewall structure forming a hole region that extends at least partially through the layer of dielectric material, a first via extending at least partially through the layer of dielectric material, the first via adjacent to the sidewall structure, the first via coupled to communicate a first signal of a differential signal pair, and a second via extending at least partially through the layer of dielectric material, the second via adjacent to the sidewall structure, the second via coupled to communicate a second signal of the differential signal pair. The system further comprises a display device coupled to the substrate, the display device to display an image based on the differential signal pair.

In an embodiment, the substrate includes a printed circuit board. In another embodiment, the substrate includes a packaging material of a packaged integrated circuit device. In another embodiment, the first via is coupled to communicate a first signal of a differential signal pair, and the second via is coupled to communicate a second signal of the differential signal pair. In another embodiment, the sidewall structures include a first curved sidewall portion and a second sidewall portion opposite the first sidewall portion. In another embodiment, a void is located in the hole region. In another embodiment, at least some of the hole region has a first dielectric disposed therein.

In another embodiment, the system further comprises a first plurality of contact pads each coupled to the first via at a different respective level of the substrate. In another embodiment, the system further comprises a second plurality of contact pads each coupled to the second via at a different respective level of the substrate. In another embodiment, the sidewall structure forms a drill process artifact. In another embodiment, a sidewall of the first via or a sidewall of the second via forms another drill process artifact. In another embodiment, a cross-sectional profile of the first via conforms to a sector of a first circle, wherein a cross-sectional profile of the second via conforms to a sector of a second circle, and wherein a cross-sectional profile of sidewall structure conforms to a sector of a third circle overlapping both the first circle and the second circle.

Techniques and architectures for exchanging signaling with via structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   a substrate including a layer of first dielectric material;
   a sidewall structure forming a hole region that extends at least partially through the layer of first dielectric material of the substrate, the sidewall structure comprising second dielectric material;
   a first via extending at least partially through the layer of first dielectric material, the first via adjacent to the sidewall structure; and
   a second via extending at least partially through the layer of first dielectric material, the second via adjacent to the sidewall structure;
   wherein a cross-sectional profile of the first via conforms to a sector of a first circle, wherein a cross-sectional profile of the second via conforms to a sector of a second circle offset from the first circle, and wherein a cross-sectional profile of the sidewall structure conforms to a sector of a third circle overlapping both the first circle and second circle, wherein a diameter of the first circle is equal to a diameter of the second circle and equal to a diameter of the third circle and wherein the third circle is part of the hole region formed by the sidewall structure having the second dielectric material located between the first via and second via.

2. The device of claim 1, wherein the substrate includes a printed circuit board.

3. The device of claim 1, wherein a packaging of the device includes the substrate.

4. The device of claim 1, the first via coupled to communicate a first signal of a differential signal pair, the second via coupled to communicate a second signal of the differential signal pair.

5. The device of claim 1, wherein the sidewall structures include a first curved sidewall portion and a second sidewall portion opposite the first sidewall portion.

6. The device of claim 1, wherein a void is located in the hole region.

7. The device of claim 1, wherein at least some of the hole region has a third dielectric disposed therein.

8. The device of claim 1, further comprising a plurality of contact pads each coupled to the first via at a different respective level of the substrate.

9. The device of claim 8, further comprising a second plurality of contact pads each coupled to the second via at a different respective level of the substrate.

10. The device of claim 1, wherein the sidewall structure forms a drill process artifact.

11. The device of claim 10, wherein a sidewall of the first via or a sidewall of the second via forms another drill process artifact.

12. A system comprising:
   a substrate including a layer of first dielectric material;
   a sidewall structure forming a hole region that extends at least partially through the layer of first dielectric material of the substrate, the sidewall structure comprising second dielectric material;
   a first via extending at least partially through the layer of first dielectric material, the first via adjacent to the sidewall structure, the first via coupled to communicate a first signal of a differential signal pair;
   a second via extending at least partially through the layer of first dielectric material, the second via adjacent to the sidewall structure, the second via coupled to communicate a second signal of the differential signal pair, wherein a cross-sectional profile of the first via conforms to a sector of a first circle, wherein a cross-sectional profile of the second via conforms to a sector of a second circle offset from the first circle, and wherein a cross-sectional profile of the sidewall structure conforms to a sector of a third circle overlapping both the first circle and second circle, wherein a diameter of the first circle is equal to a diameter of the second circle and equal to a diameter of the third circle and wherein the third circle is part of the hole region formed by the sidewall structure having the second dielectric material located between the first via and second via; and a display device coupled to the substrate, the display device to display an image based on the differential signal pair.

13. The system of claim 12, the first via coupled to communicate a first signal of a differential signal pair, the second via coupled to communicate a second signal of the differential signal pair.

* * * * *